United States Patent [15] 3,683,306
Bulthuis et al. [45] Aug. 8, 1972

[54] TEMPERATURE COMPENSATED SEMICONDUCTOR RESISTOR CONTAINING NEUTRAL INACTIVE IMPURITIES

[72] Inventors: Kornelis Bulthuis, Eindhoven, Netherlands; John Martin Shannon, Reigate, England

[73] Assignee: U.S. Philips Corporation

[22] Filed: Oct. 28, 1969

[21] Appl. No.: 870,047

[30] Foreign Application Priority Data

Nov. 19, 1968 Great Britain..........54,876/68

[52] U.S. Cl.................................338/7, 317/235 AQ
[51] Int. Cl..............................................H01c 7/06
[58] Field of Search.............338/3, 7, 8; 317/235 AQ

[56] References Cited

UNITED STATES PATENTS

| | | |
|---|---|---|
| 3,248,677 | 4/1966 | Hunter et al...................338/7 |
| 3,401,107 | 9/1968 | Redingto............317/235 AQ |
| 3,484,658 | 12/1969 | Ryosaku Komatsu.....317/234 |
| 3,457,637 | 7/1969 | Halpern...................24/578 X |

OTHER PUBLICATIONS

T. H. Yeh et al., " Diffusion of Tin into Silicon" in J. App. Phy. Vol. 39, Aug. 1968, Pp. 4266- 4271

*Primary Examiner*—Rodney D. Bennett, Jr.
*Assistant Examiner*—R. Kinberg
*Attorney*—Frank R. Trifari

[57] ABSTRACT

A temperature compensated semiconductor resistor is described wherein electrically inactive neutral impurities are included in the semiconductor. The neutral impurities do not contribute free carriers to offset mobility reduction due to lattice scattering, but instead provide an impurity scattering dependence that temperature compensates.

6 Claims, 9 Drawing Figures

Figure 1:
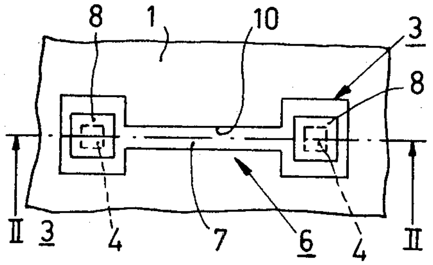

INVENTORS
KORNELIS BULTHUIS
JOHN M. SHANNON
BY
AGENT

INVENTORS
KORNELIS BULTHUIS
JOHN M. SHANNON
BY
AGENT

TEMPERATURE COMPENSATED SEMICONDUCTOR RESISTOR CONTAINING NEUTRAL INACTIVE IMPURITIES

The invention relates to a semiconductor device having a semiconductor body in which a resistance element is provided comprising a semiconductor region in which electrically active impurities are present to determine the conductivity type and to obtain free charge carriers and in which electrically inactive impurities are present to reduce the temperature coefficient of the resistance element, and to a method of manufacturing the semiconductor device.

In known semiconductor device of the above-mentioned type, see French Pat. spec. No. 1,463,448, the electrically inactive impurities consist of donors and acceptors which compensate each other, the electrically active impurities consisting of donors or acceptors which are not compensated.

In order to obtain a low temperature coefficient high concentrations of donors and acceptors compensating each other are desirable. This means that for the manufacture of such a known semiconductor device high concentrations of acceptors and donors with a well defined concentration difference are to be provided in the semiconductor region, the concentration difference determining the carrier concentration in the semiconductor region. This is very difficult so that the manufacture of such known semiconductor devices with well reproducible properties is substantially impossible. Moreover, with the present prior art, only those concentration differences can be obtained to a certain degree of reproducibility which are of the same order of magnitude as the total donor and acceptor concentrations. This means an undesirable restriction as a result of which, for example, it is impossible to obtain a small concentration difference and hence a high resistivity, since for a low temperature coefficient high concentrations of donors and acceptors compensating each other are necessary, It is known from British Pat. spec. No. 799,670 that the temperature coefficient of the resistance of a germanium body can be reduced by incorporating gold. Gold is, however, an electrically active impurity, that is to say, in addition to the temperature coefficient, gold also influences the number of free charge carriers, so that, when incorporating gold, a desired resistivity together with a desired low temperature coefficient are particularly difficult to adjust.

Furthermore, very high ohmic germanium is used which restricts the possibilities. For example, a resistance element comprising a semiconductor region with a lower resistivity as is conventional in monolithic integrated semiconductor circuits, cannot be obtained by means of a method of the kind described in the said British patent specification.

One of the objects of the invention is to avoid the said drawbacks at least partly.

The invention is based inter alia on the recognition of the fact that the said drawbacks can be avoided by using different types of impurities with which, substantially independent of each other, the concentration of free charge carriers and the temperature coefficient can be adjusted. This means that at least a significant part of the impurities reducing the temperature coefficient has to be electrically inactive, since electrically active impurities in addition influence the concentration of the free charge carriers. Moreover, the impurities to reduce the temperature coefficient should not mainly consist of donors and acceptors which compensate each other and which behave as electrically inactive impurities, since the concentration of donors and acceptors compensating each other determines the concentration difference of donors and acceptors and hence the concentration of free charge carriers.

The invention is further based on the recognition of the fact that electrically inactive impurities which do not consist of donors and acceptors compensating each other are known and/or can be found for many semiconductors and that the temperature coefficient can be reduced by incorporating said impurities. These electrically inactive uncompensated impurities are termed neutral impurities.

For clarity a few definitions will be given.

An impurity is to be understood to mean by disturbance of the ideal crystal lattice, for example, dislocations, vacancies and foreign atoms or ions which are located at interstitial or substitutional sites in the crystal lattice.

Electrically inactive impurities are impurities which do not substantially influence the concentration of free charge carriers, that is to say, which take up or give off substantially no free charge carriers; they may consist of foreign atoms or dislocations and impurities which behave as such, for example, donors and acceptors compensating each other (equivalent concentrations of donors and acceptors).

Electrically active impurities influence the number of free charge carriers (electrons and holes) and may determine the conductivity type. They include, for example, donors and acceptors when these are not compensated, traps, recombination centers and dislocations which behave as such impurities.

The invention uses the fact that a temperature coefficient which is positive due to the domination of the scattering of charge carriers through the crystal lattice, is reduced by neutral impurities in addition to electrically active impurities.

This is due to the fact that free charge carriers are also scattered by the neutral impurities which scattering results in a temperature coefficient which is smaller than the temperature coefficient due to lattice scattering only.

According to the invention, a semiconductor device of the type mentioned in the preamble is characterized in that the electrically inactive impurities consist at least for a significant part of neutral impurities. The expression "for a significant part" is to be understood to mean herein such a concentration of neutral impurities that a measurable decrease of the absolute value of the temperature coefficient can be established. By the incorporation of neutral impurities the temperature coefficient may be reduced in a simple manner with a reduced influence upon the concentration of free charge carriers.

Since the concentration of the donors or acceptors can in many cases be adjusted substantially independently of the concentration of the neutral impurities, said concentrations may differ from each other, if desired, by orders of magnitude without any difficulties occurring. As a result of this the concentration of the donors or acceptors may be very small relative to the concentration of the neutral impurities, and hence the resistivity may be large. It will be obvious that a large resistivity permits the manufacture of small and hence space-saving resistance elements.

The electrically inactive impurities preferably consist mainly of neutral impurities, since in that case the concentration of free charge carriers and the temperature coefficient can be adjusted more independently of each other and in a more reproducible manner.

In a semiconductor device according to the invention, some compensation may occur, for example, in that a resistance element is made by diffusion of an electrically active impurity (a donor or an acceptor) in a substrate of the opposite conductivity type. In this case, the effect of said compensation upon the temperature coefficient is negligible.

Preferably the semiconductor region consists of silicon, germanium or a mixed crystal of silicon and germanium and the neutral impurities consist of at least one of the elements tin and lead. The said combinations of semiconductor materials and neutral impurities give particularly favorable results.

However, the invention is not restricted to the use of silicon and germanium as semiconductor materials, e.g. $A^{III}B^{V}$-compounds are possible, with suitable neutral impurities for said compounds, for example gallium arsenide with aluminum as the neutral impurity.

The electrically active impurities in the semiconductor regions consist of normal donors or acceptors.

According to an important embodiment of the semiconductor device according to the invention, the electrically active impurity and the neutral impurity consist of the same element, the concentration of the element being so large that said concentration considerably exceeds the concentration of free charge carriers which is present in the semiconductor region due to said element. It has been found that with high concentrations of a donor or acceptor element in a semiconductor region, the concentration of free charge carriers is much smaller than the concentration of the element. Thus with high concentrations of the element both active and neutral impurities are formed.

With a semiconductor region of silicon the elements gallium, boron, aluminum, indium and antimony are found to be particularly suitable.

The invention furthermore relates to a method of manufacturing a semiconductor device according to the invention, in which such a quantity of neutral impurities is introduced into the semiconductor region that a measurable decrease of the absolute value of the temperature coefficient can be established.

This quantity of neutral impurities may differ for each individual case and can be determined experimentally in a simple manner by those skilled in the art. If the electrically active impurity and the neutral impurity consist of the same element, and the concentration of the element is larger so that said concentration considerably exceeds the concentration of free charge carriers which is present in the semiconductor region as a result of said element, the element can generally not be introduced into the semiconductor region by means of the conventional diffusion methods.

According to a preferred embodiment of the method the neutral impurities are therefore introduced into the semiconductor region by ion implantation.

Figure 2:
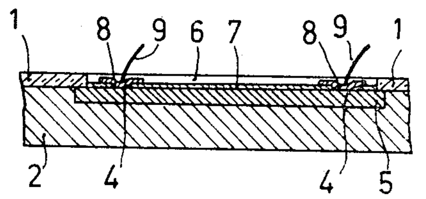
Figure 3:
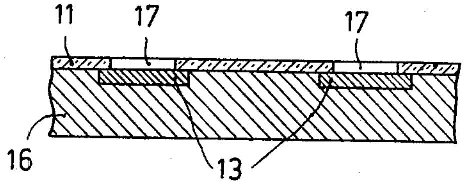
Figure 4:
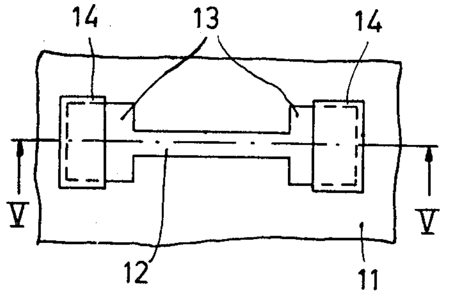
Figure 5:
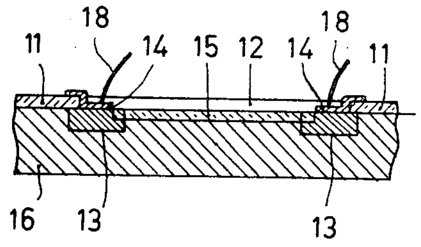
Figure 7:
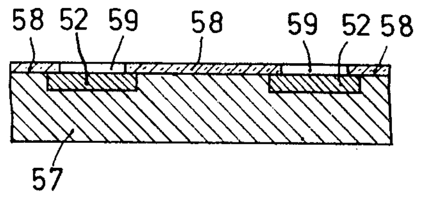
Figure 8:
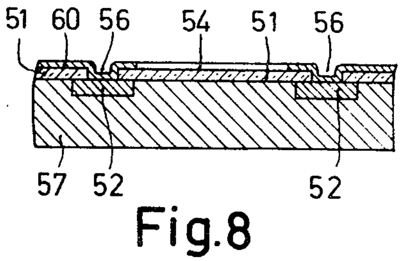
Figure 6:
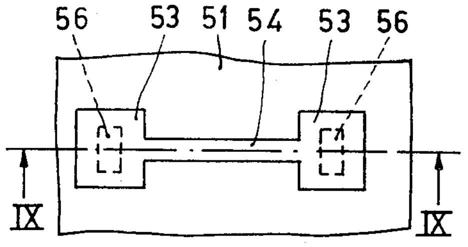
Figure 9:
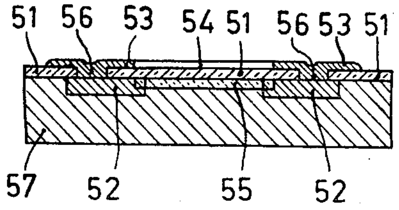

In order that the invention may readily be carried into effect, some examples thereof will now be described in greater detail with reference to the accompanying drawing, in which FIG. 1 is a plan view of a part of a first embodiment of a semiconductor device according to the invention, in a stage of the manufacture, FIG. 2 is a cross-sectional view taken on the line II—II of FIG. 1, FIG. 3 is a cross-sectional view of a part of a second embodiment of the semiconductor device according to the invention in a stage of the manufacture, FIG. 4 is a plan view of the part of the second embodiment of a semiconductor device according to the invention, in a following stage of the manufacture, FIG. 5 is a cross-sectional view taken on the line V—V of FIG. 4, FIG. 6 is a plan view of a part of a third embodiment of a semiconductor device according to the invention in a stage of the manufacture, FIGS. 7, 8 and 9 are cross-sectional views of the part of the third embodiment of the semiconductor device according to the invention, in successive stages of the manufacture of which FIG. 9 is a cross-sectional view taken on the line IX—IX of FIG. 6.

EXAMPLE 1.

In the following manner resistance elements are made in an n-type silicon crystal 2 having a resistivity of 0.3 ohm.cm and a thickness of approximately 250 $\mu$m (see FIGS. 1 and 2).

A surface layer of the crystal 2 is converted into oxide 1 in the conventional manner by heating the crystal in an oven at 1,200° C for 2 hours, oxygen which is saturated with water vapor at 98° C being conducted through said oven. An aperture 6 in the oxide is then obtained by means of a photo resist method, the ends 3 of which have proportions of 50 $\mu$m × 50 $\mu$m and are connected together by a channel-like portion 10, 200 $\mu$m length and 20 $\mu$m width. Tin is then diffused into the aperture as a neutral impurity. For this purpose the crystal 2 is heated in an oven at 1,000° C for 30 min., a gas mixture being conducted through said oven. This gas mixture has been obtained from a gas current consisting of dry $N_2$-gas with a volume rate of 400 cc per min. and a gas current consisting of $N_2$ gas which is conducted through a bottle containing liquid $SnCl_4$ with a volume rate of 100 cc per min. Subsequently there is a drive-in stage for 30 min. at 1,000° C in dry $N_2$ - gas. Boron is then diffused as an active impurity through the aperture 5 in the crystal 2. The diffusion takes place in an oven in which the silicon crystal is kept at 900° C for 1 hour and a boron nitride source at 950° C, $N_2$-gas being conducted through the oven at a volume rate of 500 cc per min. In this manner both tin and boron are diffused into the silicon, a p-type region 5 being obtained which constitutes the semiconductor region of the resistance element to be manufactured.

Finally a surface layer of the region 5 is converted into oxide 7, by heating the crystal in an oven at 1,050° C in dry $O_2$-gas for 50 min. and at 1,000° C for 30 min. in $O_2$ gas which is saturated with water vapor at 98° C.

As a result of this latter treatment the value of the resistance of the region is increased. Apertures 4 of 20

$\mu m \times 20\ \mu m$ are then made in the oxide by means of photo resist methods at the area of the ends 3 and aluminum layers 8 are provided for contacting layers. Connection conductors 9 of the resistance elements are then secured to said aluminum layers.

It follows from the geometry of the channel-like portion 10 that a resistance value is obtained which is 10 times the resistance value per square.

The value of the resistance elements thus manufactured is 1.8 kohm. and the temperature coefficient between 24° C and 100° C is 630 p.p.m. per °C. A resistance element of 1.8 k.ohm was also made of the same dimensions without tin diffusion. A higher temperature coefficient is measured, namely 850 p.p.m. per ° C.

EXAMPLE 2.

The conditions of manufacturing in this example are the same as those of the first example with the exception of the following differences. The duration of the tin diffusion in this case is 1 hour and the diffusion was carried out at 1,100° C. It is then heated in dry $N_2$ gas at 1,200° C for 2 hours. The diffusion of boron takes 10 min. and is succeeded by oxidation by heating the crystal in an oven at 1,050° C in dry $O_2$ gas for 10 min., then at 1,000° C for 1 hour in $O_2$ gas which is saturated with water vapor at 98° C and finally at 1,050° C in dry $O_2$ gas for 1 hour. The value of the resistance element thus manufactured is 4.1 k.ohm and the temperature coefficient between 24° C and 100° C was 1,060 p.p.m. per ° C.

A resistance element of 4 kOhm of the same dimensions is made without tin diffusion. A higher temperature coefficient is found namely 1,500 p.p.m. per °C in the range of 24° C to 100° C.

EXAMPLE 3.

A silicon slice 16 (see FIG. 3) having a resistivity of 3 – 5 ohm.cm and a thickness of 250 $\mu m$, with its plane approximately at right angles to the [111] orientation in the crystal lattice, is provided with an oxide layer 11 in the conventional manner. Holes 17 of 50 $\mu m \times 50\ \mu m$ are made in the oxide layer by photoresist methods. Boron is diffused into said holes up to a depth of approximately 2 $\mu m$ and a surface concentration of approximately $10^{20}$ at cc, as a result of which regions 13 are formed. In the oxide layer (see FIGS. 4 and 5,) a channel 12 is etched, 300 $\mu m$ length, 15 $\mu m$ width, between the regions 13. Aluminum is then vapor-deposited and square aluminum contacts 14 are provided on the regions 13 by means of photoresist methods. Gallium is introduced into the silicon slice via the channel 12 by ion implantation and also into the regions 13, in as far as these are not covered by the contact 14. The gallium-implanted region is denoted by 15. The implantation is effected by bombarding the slice with gallium ions in a mass separator. During this operation the slice is orientated approximately at right angles to the beam, that is to say, with a deviation of not more than approximately 4°. During the implantation the vacuum is approximately $10^{-6}$ Torr. The ion beam of the separator was defocused and swept across the slice so as to obtain a homogeneous irradiation. During the bombardment the slice is mounted on a metal holder the thermal capacity of which is large enough to avoid excessive heating of the silicon slice during the implantation.

The total dose (ions/sq.cm) is measured in the conventional manner by integration.

The dose is controlled by varying the time of bombardment and the current density. The implantation in this example is made with the isotope $GA^{69}$. The silicon slice is kept at room temperature. The energy of the ions is 60 keV. The ions do not penetrate through the oxide layer 11, which forms a mask for the ions. The thickness of this layer is between 0.5 and 1.5 $\mu m$.

Damage occurs to the crystals as a result of the bombardment. By heating the slice, the damage can be removed to a considerable extent. It is found that the damage is removed for the greater part by heating the slice in dry $N_2$ gas in an oven at 550° C for 4 hours.

The resistance element is then provided with connection conductors 18 and arranged in an envelope, if desirable.

It is to be noted that the aluminum layer instead of the oxide layer may be used as a mask for the ions by providing the contact 14 not immediately after the vapor deposition of the aluminum, but by etching the channel 12 in the aluminum layer as well as in the oxide layer. This has the advantage that the thickness of the oxide layer can be chosen more fully than when the oxide serves as a mask. In this case, first the aluminum is etched away after the implantation with the exception of those areas where the contacts 14 remain.

The following table shows a few measured results. The temperature coefficient has been measured between room temperature and 120° C.

TABLE

| | | | |
|---|---|---|---|
| Dose ions/sq.cm. | $3.10^{14}$ | $1.3.10^{15}$ | $10^{16}$ |
| Temperature coefficient | + 1000 ppm/°C | – 500 ppm/°C | – 300 ppm/°C |
| Resistance per square | 3300 Ω | 2300 Ω | 1200 Ω |
| Concentration number of atoms/cc. | $1.5.10^{19}$ | $6.5.10^{19}$ | $5.10^{20}$ |

In calculating the concentration it has been assumed that the gallium is distributed homogeneously in a layer which has a depth of 0.2 $\mu m$. The following may be derived from the table. When the concentration of gallium increases the resistance decreases. This is due to the fact that the concentration of electrically active impurities and hence the number of free charge carriers increases.

With a value of the dose between $3.10^{14}$ and $1.3.10^{15}$ ions/sq.cm. the temperature coefficient is equal to zero. This occurs at a value of the resistance per square between 3,300 and 2,300 ohm. By means of methods in which the neutral impurities are introduced by diffusion, such low temperature coefficients occur only at much lower values of the resistance per square. Resistance elements having a high resistance per square and a low temperature coefficient can thus be manufactured by means of the ion implantation method, particularly for introducing the neutral impurities. This is due to the fact that the implanted elements serve only for a part as an active impurity and for the remaining part as a neutral impurity. It was established by means of Hall measurements that with a dose of $3.10^{15}$ ions/sq.cm the number of implanted charge carriers was approximately $1.5^{14}$/sq.cm and the mobility approximately 20 $cm^2$/V.sec. From this it follows that the concentration of the neutral impurity is very much larger than the concentration of the electrically active impurity. This is confirmed by the following calculations.

$R_\square$ can be calculated from the formula $$R_\square \times 1/(e.\mu.N)$$

wherein $R_\square$ is the resistance per square, $e$ is the charge of the electron, $\mu$ the mobility and $N$ the number of charge carriers per sq.cm of the resistance region. For $N = 1.5.10^{14}$/sq.cm, $R_\square = 2{,}100$ Ohm which value lies between 1,200 and 2,300 ohm, as might be expected according to the table.

The resistance per square for the doses mentioned in the table can also be calculated from the formula, assuming that the implanted gallium behaves entirely as an active impurity. $N$, the number of charge carriers per sq.cm, is then equal to the implanted dose. $R_\square$ for the dose $3.10^{14}$/sq.cm then is approximately 700 Ohm ($\mu = 30$), $R_\square$ for the dose $1.3.10^{15}$/sq.cm approximately 240 ohm, ($\mu = 20$) and $R_\square$ for the dose $10^{16}$/sq.cm approximately 60 ohm, ($\mu = 10$).

From the comparison with the measured $R$ from the table it is found again that a large part of the implanted gallium is present as a neutral impurity and that the quantity of the neutral impurity increases with the dose since also the relation of the measured and the calculated resistance per square increases strongly.

These calculations are only approximations since the use of the formula implies that gallium is distributed homogeneously in an implanted layer. However, the differences found are so large that the conclusion is justified. Furthermore it was found that the temperature coefficient of resistance elements of which at least the neutral impurities are introduced by ion implantations, is constant over a large temperature range.

It can be seen from the table that with high doses and low resistances per square the temperature coefficient increases again. In diffused resistors this phenomenon occurs at very low resistivities and positive values of the temperature coefficient (see, for example, W.M. Bullis et al., Solid State Electronics, 1968, vol. 11, pp. 639–646). The increase of the temperature coefficient with decreasing resistance per square is presumably due to degeneracy.

EXAMPLE 4.

A silicon slice 57 (see FIGS. 6, 7, 8 and 9) having a resistivity of 3 to 5 ohm. cm and a thickness of approximately 250 $\mu$m with its plane approximately at right angles to the [111] orientation is provided with an oxide layer 58 in the conventional manner. By means of photoresist methods holes 59, 30 $\mu$m × 40 $\mu$m, are etched in the oxide layer 58. Boron is diffused into the slice through said holes, so that contact regions 52 are formed on which the contacts of the resistance element to be manufactured are afterwards provided. The depths of the contact regions is approximately 1.5 $\mu$m and their resistance per square 40 – 60 ohm. The oxide layer 58 is then etched away and a new oxide layer 51, 2,000 A thick, provided in the same manner as described above. Holes 56, 30 $\mu$m × 16 $\mu$m ARE etched in the oxide layer 51. An aluminum layer 60 is then vapor-deposited to a thickness of approximately 1 $\mu$ m. A channel 54, 186 $\mu$m × 20 $\mu$m, is then etched in the aluminum layer 60 between the diffused regions 52. In the subsequent implantation the aluminum layer is used as a mask and boron is implanted in the underlying silicon via the channel 54 through the oxide layer 51 so that the region 55 is obtained. A dose of $6.10^{15}B^{11}$-ions/sq.cm with an energy of 60 keV is implanted.

After the implantation the aluminum layer is etched away with the exception of squares 53 of 50 $\mu$m × 50 $\mu$m which constitute the contacts with the contact regions 52. Then the slice is heated in dry $N_2$ gas at 500° C for 30 min. and the measured resistance per square is 2,700 ohm and the temperature coefficient −700 p.p.m. °C. This small value is due to the large fraction of electrically inactive boron impurities.

The device according to the invention also include those devices in which in addition to the resistance element at least one further circuit element, for example, a transistor, is present in the semiconductor device.

The invention is not restricted to the examples described. For example, crystal damage introduced by electron bombardment, can form crystal dislocations which act as neutral impurities. The use of crystal dislocations has the advantage that the concentration of neutral impurities can be changed by a treatment at high temperature.

The choice of the semiconductor material is not restricted to silicon. Germanium, mixed crystals of silicon and germanium, $A^{III}B^{V}$- or $A^{II}B^{VI}$-compounds may alternatively be used. Instead of tin, lead may be diffused or implanted into germanium or mixed crystals of silicon and germanium as a neutral impurity.

What is claimed is:

1. A semiconductor device having a semiconductor body containing a resistance element, said resistance element comprising a semiconductor region and spaced connections to the region, said semiconductor region containing electrically active impurities determining its conductivity type and producing free charge carriers therein whereby said resistance element has a given temperature coefficient of resistance, said semiconductor region also containing electrically inactive neutral impurities in an amount producing a significant reduction of the said temperature coefficient of resistance.

2. A semiconductor device as set forth in claim 1 wherein the semiconductor region is a substance selected from the group consisting of silicon, germanium and mixed crystals thereof, and the neutral impurities are elements selected from the group consisting of tin and lead.

3. A semiconductor device as set forth in claim 2 wherein the electrically active impurities are donors or acceptors.

4. A semiconductor device having a semiconductor body containing a resistance element, said resistance element comprising a semiconductor region and spaced connections to the region, said semiconductor region containing electrically active impurities determining its conductivity type and producing free charge carriers therein whereby said resistance elements has a given temperature coefficient of resistance, said semiconductor region also containing an additional concentration of said impurities in considerable excess of the free charge carrier concentration present such that neutral impurities are formed producing a significant reduction of the said temperature coefficient of resistance.

5. A semiconductor device as set forth in claim 4 wherein the semiconductor region is of silicon, and the impurities are elements selected from the group consisting of gallium, boron, aluminum, indium and antimony.

6. A semiconductor device as set forth in claim 5 wherein the additional concentration is ion implanted.

* * * * *

PO-1050
(5/69)

UNITED STATES PATENT OFFICE
CERTIFICATE OF CORRECTION

Patent No. 3,683,306 Dated August 8, 1972

Inventor(s) KORNELIS BULTHUIS and JOHN MARTIN SHANNON

It is certified that error appears in the above-identified patent and that said Letters Patent are hereby corrected as shown below:

Title Page, Section [30] Foreign Application Priority Data, "54,876/68" should read "54,878/68".

Signed and sealed this 9th day of January 1973.

(SEAL)
Attest:

EDWARD M.FLETCHER,JR.
Attesting Officer

ROBERT GOTTSCHALK
Commissioner of Patents